US006621135B1

(12) United States Patent
Sridhar et al.

(10) Patent No.: US 6,621,135 B1

(45) Date of Patent: Sep. 16, 2003

(54) MICRORELAYS AND MICRORELAY FABRICATION AND OPERATING METHODS

(75) Inventors: Uppili Sridhar, Singapore (SG); Quanbo Zou, Singapore (SG)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/253,728

(22) Filed: Sep. 24, 2002

(51) Int. Cl.[7] .............................................. H01L 29/82

(52) U.S. Cl. ........................ 257/415; 257/418; 257/419

(58) Field of Search ................................ 257/415, 418, 257/419

(56) References Cited

U.S. PATENT DOCUMENTS 6,162,657 A * 12/2000 Schiele et al. ................ 438/52
6,239,685 B1 * 5/2001 Albrecht et al. ............ 337/365
6,486,425 B2 * 11/2002 Seki ........................... 200/181
2002/0160549 A1 * 10/2002 Subramanian et al. ........ 438/52
2003/0006868 A1 * 1/2003 Aigner et al. ................. 335/78

* cited by examiner

*Primary Examiner*—Ngân V. Ngô
(74) *Attorney, Agent, or Firm*—Blakely, Sokoloff, Taylor & Zafman LLP

(57) ABSTRACT

Microrelays and microrelay fabrication and operating methods providing a microrelay actuator positively controllable between a switch closed position and a switch open position. The microrelays are a five terminal device, two terminals forming the switch contacts, one terminal controlling the actuating voltage on an actuator conductive area, one terminal controlling the actuating voltage on a first fixed conductive area, and one terminal controlling the actuating voltage on a second fixed conductive area deflecting the actuator in an opposite direction than the first fixed conductive area. Providing the actuating voltages as zero average voltage square waves and their complement provides maximum actuating forces, and positive retention of the actuator in both actuator positions. Various fabrication techniques are disclosed.

13 Claims, 4 Drawing Sheets

MICRORELAYS AND MICRORELAY FABRICATION AND OPERATING METHODS

BACKGROUND OF THE INVENTION

1. Field of the Invention

The present invention relates to the field of microrelays.

2. Prior Art

Microrelays are currently being developed for low frequency and RF switching applications. A class of these devices is operated by electrostatic force and provides low form factor, low power consumption and excellent signal isolation capabilities. In general, electrostatic microrelays consist of four electrodes and an actuator (four terminal devices). Two electrodes, called the actuation electrodes, provide the attractive force for the actuator on application of an electric potential (voltage) difference between an electrode on the actuator and a fixed actuation electrode. The other two electrodes, called contact electrodes, switch the signal of interest when contacted and shorted together by an otherwise isolated, conductive area on the actuator. Such electrostatically operated microrelays have great potential in various markets, including automatic test equipment and telecommunications markets.

Typically in a microrelay, the contacts have to be at least 10 microns apart in the relay switch open condition to achieve good electrical breakdown and isolation performance. One known fabrication technique involves forming the actuator on a substrate, the actuator being separated from the substrate by a sacrificial layer that is etched away near the end of the fabrication process. However, increasing the gap between the actuator switching electrode and the fixed switching electrodes requires very thick sacrificial layers during the fabrication process, which is a non-trivial operation. Other schemes such as forming a wedge actuator with a controlled bending of the released actuator by built in stress layers is also difficult to control.

In addition, electrostatically operated microrelays can exhibit erratic operating characteristics if not suitably energized. In particular, the actuator electrodes providing the electrostatic operating force due to the voltage difference between the electrodes should not touch, as touching will short out the voltage difference, potentially damaging the relay and at best, temporarily removing the electrostatic actuating force. One way to avoid this is to put a layer of insulation on one or both actuating electrodes. However electric charge can build up on the insulating layers, providing a substantial electrostatic force on the actuator when the actuating electrodes are at the same voltage, or detracting from the electrostatic force on the actuator when the actuating electrodes are at intended actuating voltage differences. This effect can be minimized by grounding one electrode and driving the other electrode with a zero average voltage square wave, or driving the two actuating electrodes with complementary zero average voltage square waves. However, because the electrostatic force obtained is proportional to the square of the voltage difference between the actuating electrodes, the electrostatic force, when present, is always attractive. There is no repelling force that may be generated to open and hold the microrelay relay contacts open.

BRIEF SUMMARY OF THE INVENTION

Microrelays and microrelay fabrication and operating methods providing a microrelay actuator positively controllable between a switch closed position and a switch open position. The microrelays are a five terminal device, two terminals forming the switch contacts, one terminal controlling the actuating voltage on an actuator conductive area, one terminal controlling the actuating voltage on a first fixed conductive area, and one terminal controlling the actuating voltage on a second fixed conductive area deflecting the actuator in an opposite direction than the first fixed conductive area. Providing the actuating voltages as zero average voltage square waves and their complement provides maximum actuating forces, and positive retention of the actuator in both actuator positions. Various fabrication techniques are disclosed.

DETAILED DESCRIPTION OF THE PREFERRED EMBODIMENT

In accordance with the present invention, a five electrode microrelay is provided. The microrelay is comprised of an actuator in the form of a microspring supported and/or flexible region between first and second opposing faces on the interior of a hermetically sealed package. Of the five electrodes, four electrodes correspond to the four electrodes commonly used in the prior art, namely first and second electrodes making contact with a conductive region on the actuator and a cooperatively disposed conductive area on the first opposing face, respectively, to provide the actuating electrodes for the device, and third and fourth electrodes on the first opposing face forming the switch contacts which are closed by contact by another conductive region on the actuator. In addition, in the present invention, a fifth electrode is provided, providing contact to a conductive area on the second opposing face. The conductive area on the second opposing face is adjacent the conductive area on the actuator connected to one of the actuating electrodes. In this way, a voltage difference between the first and second electrodes will deflect the actuator to close the microrelay switch, and a voltage difference between the first and second electrodes will deflect the actuator to open the microrelay switch and hold it open.

The use of the fifth electrode provides a number of advantages. It allows attracting the actuator to either extreme of its deflection in normal operation, so that in its free state, the actuator need not provide the normally required switch open contact separation. This eases some accuracy requirements for the free state position, and if the actuator is fabricated on a semiconductor substrate, reduces the thickness of the sacrificial layer that must be removed to free the actuator from the substrate on which it is formed. It also may decrease the microrelay's sensitivity to vibration and make its switching action more positive by holding the actuator against fixed stops in both actuator positions. This avoids actuator vibration when in the switch open position, thereby providing a more positive switching action and avoiding a possible buildup of resonance deflections when used in a vibration environment.

Figure 1:
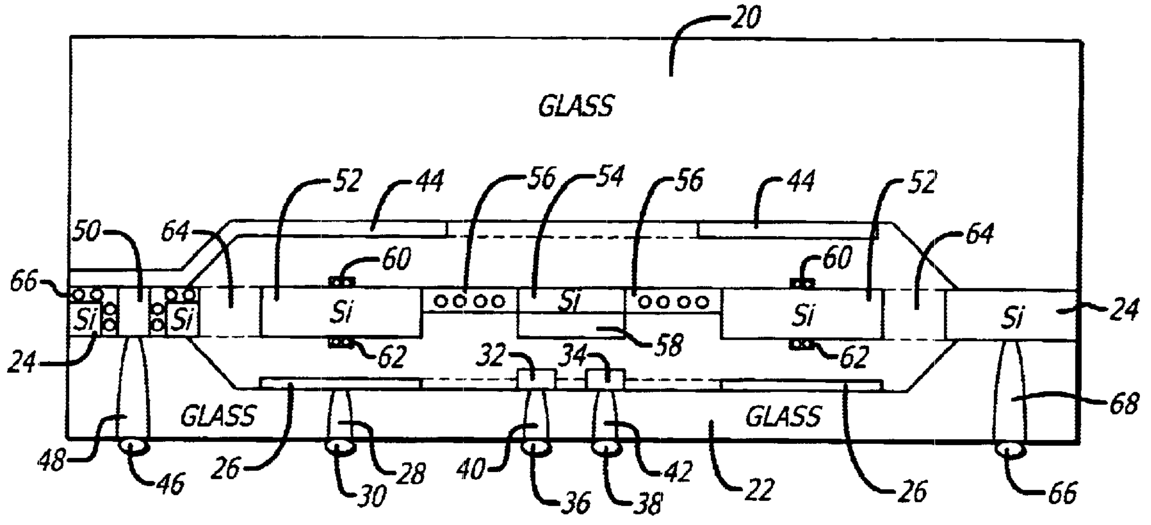
FIG. 1 is a schematic cross section of a microrelay in accordance with the present invention.

The fifth electrode described above provides a third microrelay actuation electrode. Considering the first actuation electrode to be coupled to a conductive area on the first opposing surface and the second actuation electrode coupled to a conductive area on the actuator Now referring to FIG. 1, a cross-section of an exemplary embodiment of the present invention may be seen. This cross-section, of course, is not to scale, as proportions, layer thicknesses, ect. have been changed and exaggerated for illustration purposes, some exemplary dimensions, materials and process for the fabrication of a microrelay generally in accordance with FIG. 1 being subsequently described. The exemplary microrely of FIG. 1 is an assembly of three separate fabricated parts, specifically, a glass top cap 20, a glass bottom cap and an intermediate silicon member 24 in and on which the actuator is formed. For clarity in FIG. 1, the glass caps have been labeled as glass, the silicon areas are identified by an Si notion, oxide region by 'o's within the oxide regions, and metal regions by cross-hatching. Further, lines visible in the background of the cross-section are shown as dashed lines to show the mechanical and electrical interconnection of conductive regions (metal and silicon) while better making clear that such structure is not in the plane of the cross-section shown.

In the embodiment shown in FIG. 1, the upper facing surface of the bottom cap 22 has a conductive region 26, specifically a metallized via 28 to a solder ball terminal 30. The conductive region 26 is referred to above as a second conductive region in the general description of the five terminal microrelay of the present invention. Also on the upper surface of bottom cap 22 are additional metallized regions 32 and 34, also electrically accessible through solder ball terminals 36 and 38, respectively, by way of metallized vias 40 and 42, respectively. Metallized regions 32 and 34 are referred to in the foregoing general description as the third and fourth conductive regions. The top cap 20 also has a conductive region, specifically metallized region 44, electrically accessible through solder ball terminal 46 and metallized vias 48 and 50.

Sandwiched between top cap 20 and bottom cap 22 in this embodiment is a conductive silicon member 24 with integral actuator member comprised of silicon regions 52 and 54 electrically separated by oxide regions 56, or alternatively by multiple trenches filled with an oxide. Silicon region 54 has a metallized region 58 on the lower surface thereof, with silicon region 52 having small oxide regions or bumps 60 and 62 on opposite surfaces thereof. The entire actuator is supported on spring regions 64, better seen in the bottom face view of the silicon member of FIG. 2. Referring still to FIG. 1, contact to the silicon region 24 is provided through solder ball terminal 66 and metallized via 68, with metallized vias 48 and 50 providing electrical contact between solder ball terminal 46 and metallized region 44, being insulated from silicon region 24 by oxide layer 66 isolating the via from the silicon region. Many of these regions may also be seen from the bottom face view of the actuator of FIG. 2.

The microrelay of FIG. 1 may be energized a number of different ways. By way of example, applying a substantial DC voltage between silicon regions 52 forming the first conductive region and metallized region 26 forming the second conductive region with no voltage between silicon regions 52 and metallized regions 44 will cause the actuator to deflect downward, bringing metallized region 58 into contact with the third and fourth conductive regions 32 and 34, respectively, to provide switch closure between terminals 36 and 38. Similarly, holding silicon regions 52 and metallized regions 26 at the same voltage and providing a high voltage difference between silicon regions 52 and metallized region 44 will cause the actuator to deflect upward, providing the maximum gap between metallized region 58 on the actuator and fixed metallized regions 32 and 34 forming the microrelay switch contacts. The use of DC actuation voltages, however, has a tendency to cause the buildup of charge on insulative layers, and accordingly is not preferred. Also as previously mentioned, except for the switch elements themselves, the conductive regions on the actuator should not contact the conductive actuation regions on the top and bottom caps, as such contact will short out the actuation voltage with undesirable, if not catastrophic, effect. Thus, the small oxide regions or bumps 60 and 62 are provided, rather than a full insulative region separating the conductive actuation regions to provide the desired electrically insulating effect while minimizing the amount of insulation used. Of course, the number and position of the bumps may be chosen as desired to avoid such contact.

The preferable form of excitation of the microrelay of FIG. 1 is an AC excitation, more preferably a square wave excitation and most preferably a zero average square wave excitation. One form of square wave excitation that may be used is to hold the first conductive region 52 on the actuator at zero volts. Then for switch closure, the zero average voltage square wave would be applied to the second conductive region 26 and the fifth conductive region 44 also held at zero volts. For holding the microrelay switch open, second conductive region 26 would be held at zero volts and the zero average voltage square wave applied to the fifth conductive region 44. The zero average voltage square wave excitation has the advantage of minimizing charge buildup on any insulative region because of its zero average value, with square wave excitation providing rapid crossover between positive and negative actuation voltages so that the actuator will remain latched at the relay switch closed and relay switch open positions as commanded by the excitation without requiring a particularly high frequency for the square wave.

A more preferred form of actuation control for the microrelays of the present invention is to provide a zero average voltage square wave excitation to the conductive regions 52 on the actuator and a complementary (shifted 180°) zero average voltage square wave on the respective fixed conductive areas (26 or 44) for attraction of the actuator to the microrelay switch closed and microrelay switch open positions, respectively. For switch closure, the attractive force between conductive regions 52 on the actuator and conductive regions 44 on the top cap 20 may be minimized by providing the same phase zero average voltage square wave excitation to the conductive regions 44 as on the conductive regions 52 of the actuator. Similarly, for switch open purposes, the attractive forces between the actuator and conductive regions 26 on the bottom cap 22 may be minimized by providing the same zero average voltage square wave excitation to conductive regions 26 as provided to the actuator conductive regions 52 to hold the switch open.

The use of a zero average voltage square wave on the actuator and one of the fixed actuation conductive regions and a complementary zero average value square wave on the other fixed actuation conductive region has substantial advantages, particularly if the square wave voltage usable is limited by the available power supply voltage and not by breakdown or arcing between conductive regions used for actuation. In particular, while the average voltage difference between a zero average voltage square wave and a zero voltage is equal to the voltage of the square wave, the average voltage difference between a zero average voltage square wave and its complement is twice the voltage of the square wave, thereby providing four times the actuation force. Actually, in the present invention, the force of the actuator spring suspension further aids the initial motion of the actuator from either extreme position.

The embodiment illustrated in FIG. 1 may be fabricated using techniques generally well known in integrated circuit fabrication. In that regard, the microrelay is generally of typical integrated circuit size, with a large number of microrelays being fabricated using wafer fabrication techniques and diced in a rather conventional manner to form individual (or multiple) microrelay units. The top cap 20 may be readily fabricated by etching the cavity shown and depositing and patterning a metal layer. The silicon actuator may be fabricated starting, by way of example, with a p-type silicon substrate with a thin p++ epi layer on one surface, with a further p-type epi layer thereover. In this fabrication technique, the upper surface of silicon member 24 of FIG. 1 represents the upper surface of the p-type epi layer on the substrate. Thus in this process, directional etching may be used to form pockets for oxide regions 56 and the hole in silicon region 24 for via 50. Then the oxide regions may be deposited and patterned as desired. Note that at this stage, the silicon member 24 is of full wafer thickness. The silicon member 24 may be anodic bonded to the top cap 20, and the silicon member KOH etched to the etch stop formed by the p++ epi layer.

The use of a zero average voltage square wave on the actuator and one of the fixed actuation conductive regions and a complementary zero average value square wave on the other fixed actuation conductive region has substantial advantages provided the square wave voltage usable is limited by the available power supply voltage and not by breakdown or arcing between conductive regions used for actuation. In particular, where the average voltage difference between a zero average voltage square wave and a zero voltage is equal to the voltage of the square wave, the average voltage difference between a zero average voltage square wave and its complement is twice the voltage of the square wave, thereby providing four times the actuation force.

The embodiment illustrated in FIG. 1 may be fabricated using the general techniques well known in integrated circuit fabrication. In that regard, the microrelay is generally of typical integrated circuit size with a large number of microrelays being fabricated using wafer scale fabrication techniques and diced in a rather conventional manner to form individual (or multiple) microrelay units.

The top cap 20 may be readily fabricated by etching the cavity shown and depositing and patterning a metal layer. The silicon actuator may be fabricated starting, by way of example, with a p-type silicon substrate with a thin p++ epi layer on one surface, with a further p-type epi layer thereover. In this fabrication technique, the upper surface of silicon member 24 of FIG. 1 represents the upper surface of the p-type epi layer on the substrate. Thus in this process, directional etching may be used to form pockets for oxide regions 56 and the hole in silicon region 24 for via 50. Then the oxide regions may be deposited and patterned as desired, and the top cap bonded to the silicon member using an anodic bond. Note that at this stage, the silicon member 24 is effectively of full wafer thickness, though now has the support of the top cap and may be etched using the P++ layer as an etch stop, with the p++ layer than being removed. Now the bottom of the silicon member 24 may be completed by a patterned etch of the silicon layer, including forming of the springs 64 and deposit of the oxide bumps 62. Alternatively, the spring outline may be defined by an etch, such as a directional etch, before the two members are joined, being only cut free, so to speak, when etching to the p++ layer after joining.

Figure 2:
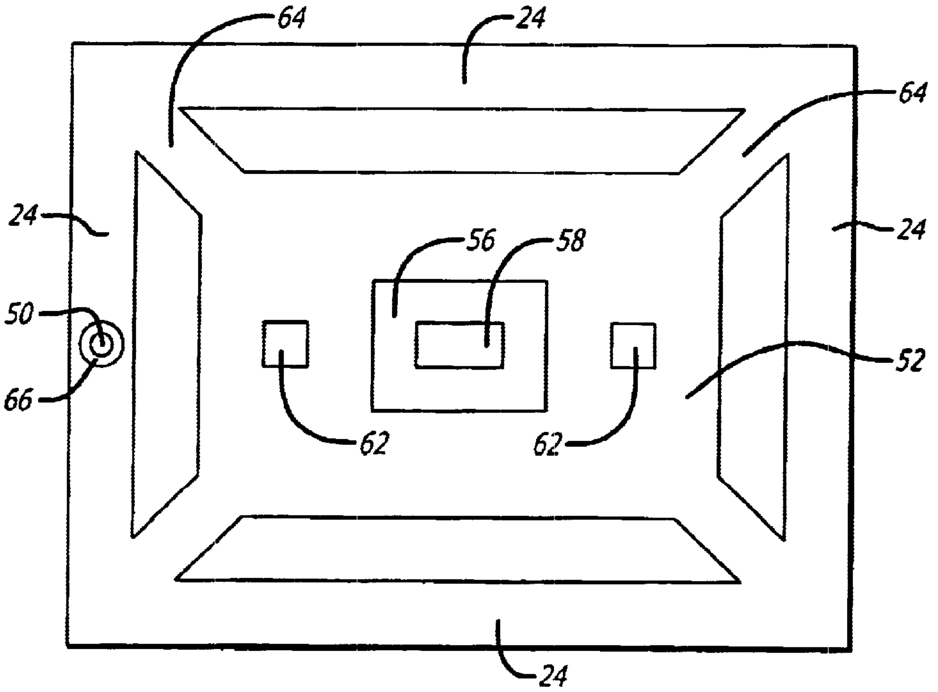
FIG. 2 is a plan view of an exemplary actuator for the embodiment of FIG. 1.
Figure 3A:
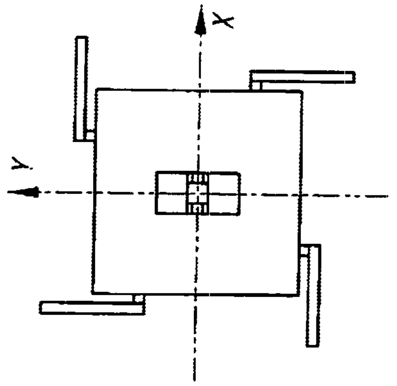
FIGS. 3*a* through 3*g* illustrate various exemplary alternate spring configurations for the actuator.
Figure 3B:
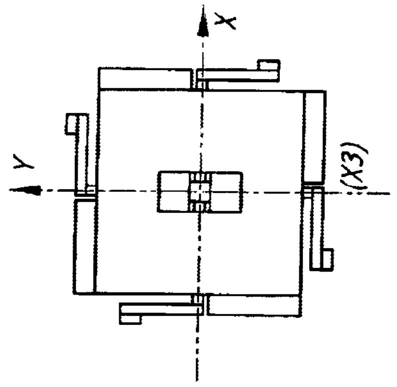
Figure 3C:
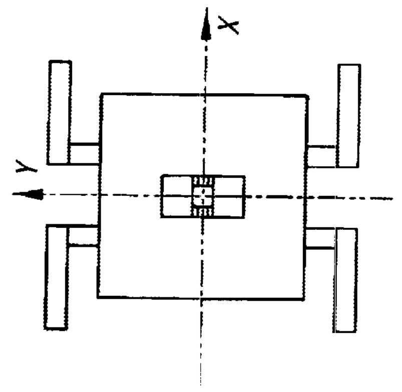
Figure 3D:
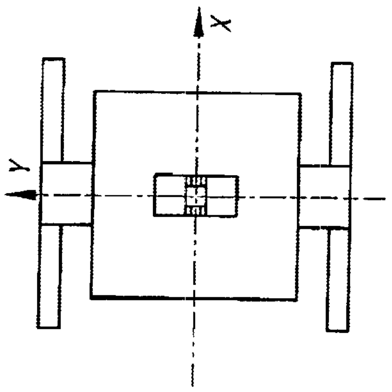
Figure 3E:
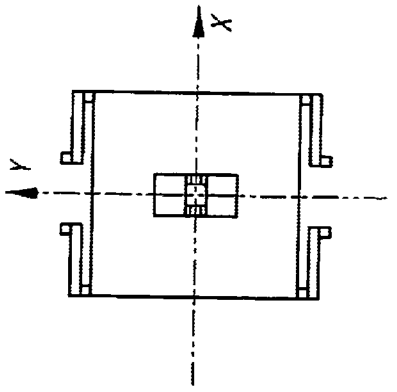
Figure 3F:
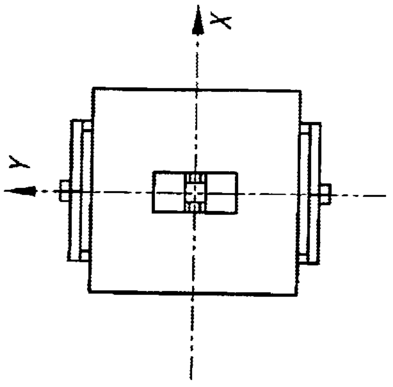
Figure 3G:
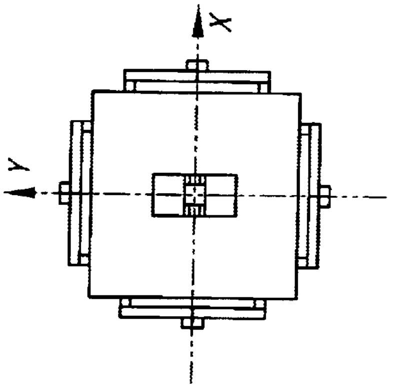

Note that while four springs 64 are shown in FIG. 2, a lesser number, such as two springs, may be used. Also the springs may be patterned and proportioned, and made with a thickness as desired to provide the desired spring rate, though note that because the spring deflection is in both directions, rather than between a flexed and a neutral position, a higher spring rate may be used with the present invention than in the prior art to achieve the same switch contact separation in the switch open condition. Various exemplary alternate spring configurations may be seen in FIGS. 3*a* through 3*g*. These configurations generally provide additional spring lengths, substantially reducing the spring rates for the same spring thickness. Many of these configurations also provide some spring rate in the plane of the actuator, helping to absorb any differential thermal expansion of between the silicon actuator and the glass cap or caps, both from processing and environmental changes. Some of the configurations, such as those of FIGS. 3*a* and 3*b* by way of example, substantially avoid significant spring rate changes by avoiding imposing tensile or compressive forces on the springs from differential thermal expansion.

The glass bottom cap 22 may be initially fabricated in a manner similar to that of the glass top cap 20, by etching to form the recess and depositing and patterning the metal layers. (In a preferred embodiment, the metal switch pads 32 and 34 are of a noble metal such a gold, though the metal actuation regions need not be.) Then the bottom cap 22 may be anodic bonded to the silicon member 24 to hermetically seal the microrelay, after which the bottom cap may be ground back to a thickness such as on the order of 50 to 100 microns. Then contact openings may be formed in the glass bottom cap using the metal layers as an etch stop without loosing hermeticity, metal deposited and etched to fill the openings so formed (forming metal vias 48, 28, 40, 42 and 68), and solder balls 46, 30, 36, 38 and 66 formed to complete the microrelays, ready for dicing.

As one alternate embodiment, the recesses initially formed in either or both of the glass caps 20 and 22 may be instead formed on one or both surfaces of the silicon member 24, though a recess in the silicon member facing bottom cap 22, if used, would need to be formed in the epi layer after etching to the p++ layer and subsequently removing the p++ layer.

As a further alternate embodiment, the microrelay may be fabricated from two members, a silicon top cap and actuator, and a glass bottom cap (referenced to FIG. 1). The actuator in this embodiment is formed on a sacrificial oxide layer on the silicon member, and freed by etching away the sacrificial layer through openings in the actuator for that purpose using appropriate etch stops. Such techniques are known in the art, and need not be described in great detail herein. Note however, that the sacrificial layer in the present invention will be thinner than in the prior art, more readily facilitating its removal.

Figure 4:
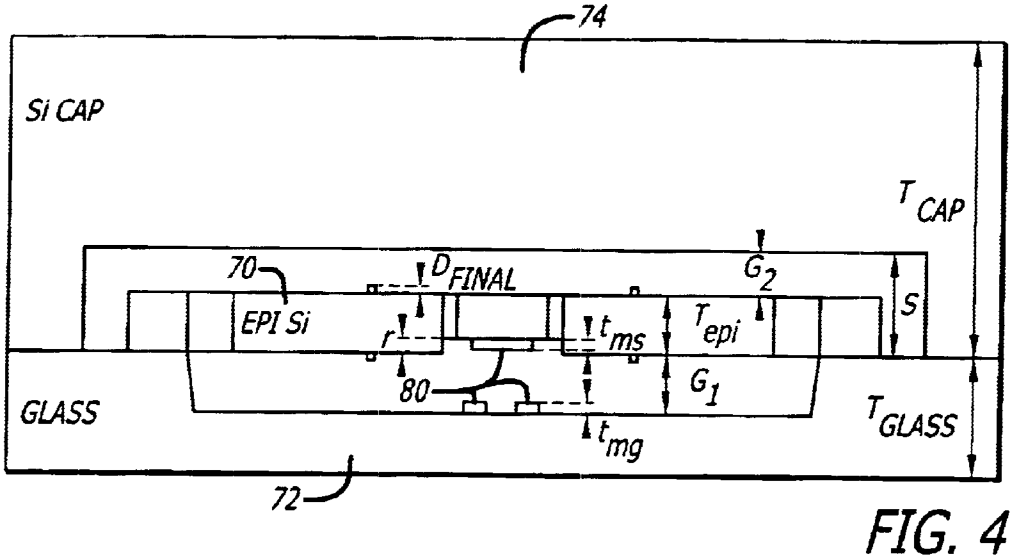
FIGS. 4, 5 and 6 schematically illustrate cross sections of another embodiment in the unpowered state, the off state and the on state, respectively.
Figure 5:
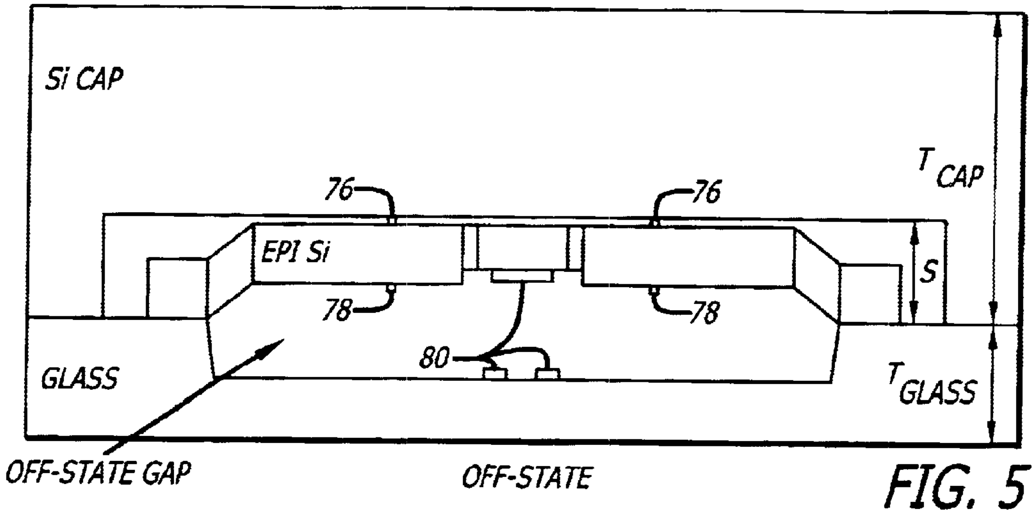
Figure 6:
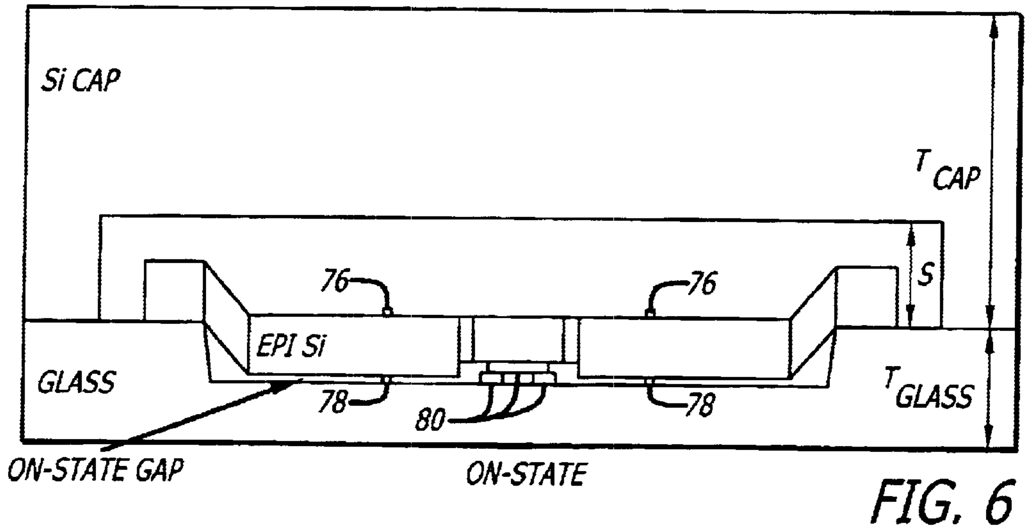

Now referring to FIGS. 4, 5 and 6, schematic cross sections of another embodiment may be seen. In this embodiment, an actuator 70 is bonded to a glass cap 72. A silicon cap 74 is also bonded over to the glass cap 72 to enclose the actuator. The silicon cap is bonded to the glass cap beyond the periphery of the actuator so that the silicon actuator and the silicon cap are electrically isolated from each other. The metallized region on the silicon cap equivalent to layer 44 of the embodiment of FIG. 1 may be insulated from the silicon cap by use of an intermediate oxide layer.

Figure 7:
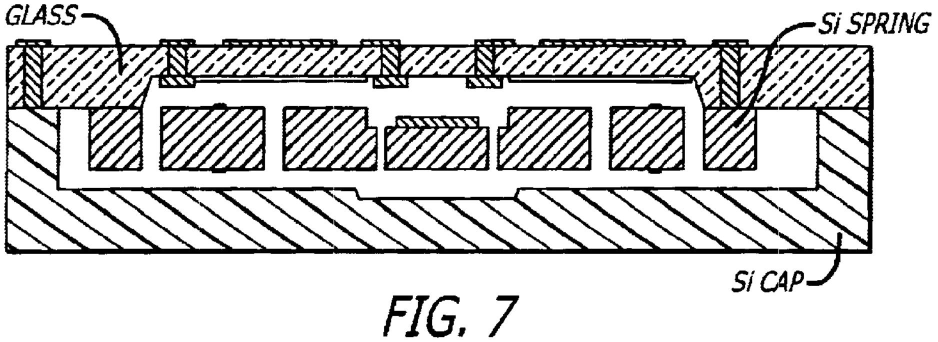
FIGS. 7 and 8 illustrate a further alternate embodiment, showing a schematic cross section and an exploded view of this embodiment.
Figure 8:
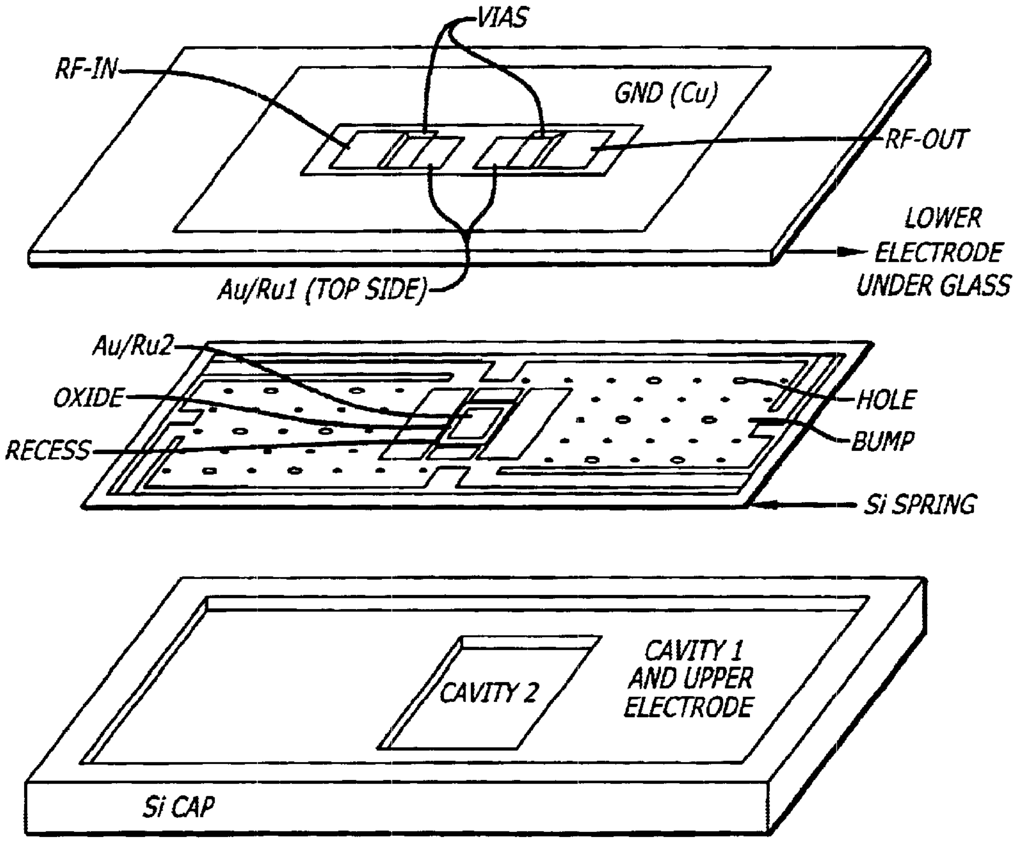

FIGS. 5 and 6 illustrate the embodiment of FIG. 4 showing the relay in the off state and the on state (relay closed), respectively. In the off state, oxide bumps 76 on the actuator (alternatively on the silicon cap 74) prevent direct electrical contact between the actuator and the metallized regions on the silicon cap 74. In the on state, oxide bumps 78 prevent direct electrical contact between the actuator and the metallized regions on the glass cap 72, and further prevent the actuator from rotating excessively about an axis in the plane of the actuator. In that regard, the relay contacts 80 may have an adequate footprint to prevent rotation of the actuator to assure positive contact between the contact on the actuator and the two contacts on the glass cap. Alternatively, or in addition, the relay contact 80 on the actuator may itself be spring mounted relative to the rest of the actuator so that the relay contact on the actuator may deflect slightly relative to the rest of the actuator for positive contact with both fixed contacts 80. Such spring mounting of the contact portion of the actuator could also allow insulative bumps 78 to contact the glass cap (or conductive layer thereon) aligning the actuator with respect thereto and providing a fixed and repeatable switch closure force. Such a configuration is shown in FIGS. 7 and 8. These Figures, which illustrate a further alternate embodiment, though turned over relative to the prior embodiments, show a schematic cross section and an exploded view of this embodiment. As best seen in FIG. 8, spring regions 82 support the contact 80 on the actuator, which in addition can also reduce the parasitic capacitance of the relay switch when used to switch RF frequencies.

The foregoing description is intended to be illustrative only of certain exemplary embodiments, and not by way of limitation of the invention, as numerous further alternative embodiments in accordance with the invention will be apparent to those skilled in the art. Thus while certain preferred embodiments of the present invention have been disclosed herein, it will be obvious to those skilled in the art that various changes in form and detail may be made in the invention without departing from the spirit and scope of the invention as set out in the full scope of the following claims.

What is claimed is:

1. A microrelay comprising:

a micromachined deflectable actuator having first and second actuator surfaces and first and second conductive regions electrically isolated from each other;

a first cap having a first cap surface adjacent the first actuator surface, the first cap having third, fourth and fifth conductive regions electrically isolated from each other, the third conductive region being adjacent the first conductive region, the fourth and fifth conductive regions being adjacent the second conductive region;

a second cap having a second cap surface adjacent the second surface of the actuator, the second cap having a sixth conductive region adjacent the first conductive region;

the actuator being deflectable in a first direction to allow the second conductive region to contact the fourth and fifth conductive region, and the first and third conductive regions to not electrically contact each other;

the actuator being deflectable in a second direction opposite the first direction so that the first and sixth regions move closer without electrically contacting each other;

the actuator being hermetically sealed within the microrelay, the first, third, fourth, fifth and sixth conductive regions being electrically accessible externally to the microrelay.

2. The microrelay of claim 1 further comprised of at least one electrically insulative region between the first and third conductive regions.

3. The microrelay of claim 2 wherein the electrically insulative region between the first and third conductive regions is smaller in area than the first and third conductive regions.

4. The microrelay of claim 1 further comprised of at least one electrically insulative region between the first and sixth regions.

5. The microrelay of claim 4 wherein the electrically insulative region between the first and sixth conductive regions is smaller in area than the first and sixth conductive regions.

6. The microrelay of claim 1 wherein the actuator and second cap are fabricated as an integral micromachined part.

7. The microrelay of claim 6 wherein the actuator and second cap are fabricated starting with a silicon semiconductor substrate.

8. The microrelay of claim 7 wherein the first cap is a glass cap.

9. The microrelay of claim 8 wherein the first, third, fourth, fifth and sixth conductive regions are electrically accessible externally to the microrelay through contacts on a second cap surface of the first cap.

10. The microrelay of claim 1 wherein the actuator, the first cap and the second cap are fabricated as separate micromachined parts.

11. The microrelay of claim 10 wherein the actuator is fabricated starting with a silicon semiconductor substrate.

12. The microrelay of claim 11 wherein the first and second caps are glass caps.

13. The microrelay of claim 8 wherein the first, third, fourth, fifth and sixth conductive regions are electrically accessible externally to the microrelay through contacts on a second cap surface of the first cap.

* * * * *